(12) United States Patent
Nakano et al.

(10) Patent No.: US 6,915,653 B2
(45) Date of Patent: Jul. 12, 2005

(54) SEMICONDUCTOR COOLING DEVICE

(75) Inventors: Masao Nakano, Shiga (JP); Akira Ikeda, Kusatsu (JP); Hiromasa Ashitani, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/821,219

(22) Filed: Apr. 8, 2004

(65) Prior Publication Data

US 2004/0250558 A1 Dec. 16, 2004

(30) Foreign Application Priority Data

Jun. 13, 2003 (JP) ........................................ 2003-169081

(51) Int. Cl.[7] ............................................. F25D 23/12
(52) U.S. Cl. ............................... 62/259.2; 165/104.33; 361/695; 361/699; 361/698
(58) Field of Search ...................... 62/132, 183, 228.4, 62/229, 259.2; 165/80.3, 80.4, 104.33, 122; 361/689, 695, 699, 698; 257/714, 716; 174/15.1, 16.1, 16.3

(56) References Cited

U.S. PATENT DOCUMENTS

| | | | | | |
|---|---|---|---|---|---|
| 4,812,733 | A | * | 3/1989 | Tobey | 323/285 |
| 5,455,458 | A | * | 10/1995 | Quon et al. | 257/714 |
| 5,729,995 | A | * | 3/1998 | Tajima | 62/259.2 |
| 5,747,728 | A | * | 5/1998 | Fleurial et al. | 136/203 |
| 5,859,763 | A | * | 1/1999 | Nam et al. | 361/699 |
| 5,871,859 | A | * | 2/1999 | Parise | 320/150 |
| 6,057,050 | A | * | 5/2000 | Parise | 429/7 |
| 6,101,815 | A | * | 8/2000 | van Oort et al. | 62/3.4 |
| 6,158,232 | A | * | 12/2000 | Tsuji et al. | 62/259.2 |
| 6,367,543 | B1 | * | 4/2002 | Calaman et al. | 165/80.4 |
| 6,458,319 | B1 | * | 10/2002 | Caillat et al. | 420/576 |
| 6,578,626 | B1 | * | 6/2003 | Calaman et al. | 165/80.4 |
| 6,623,596 | B1 | * | 9/2003 | Collins et al. | 156/345.48 |

FOREIGN PATENT DOCUMENTS

| | | | | |
|---|---|---|---|---|
| JP | 405121604 A | * | 5/1993 | |
| JP | 406037219 A | * | 2/1994 | |
| JP | 2000-208683 | | 7/2000 | |

* cited by examiner

Primary Examiner—William E. Tapolcai
Assistant Examiner—Mohammad M. Ali
(74) Attorney, Agent, or Firm—RatnerPrestia

(57) ABSTRACT

A semiconductor cooling device includes a cold plate for cooling a semiconductor element, a condenser, and an inverter-controlled refrigerant pump, all of which are fluid connected in series with each other to define a refrigerating cycle. The semiconductor cooling device also includes a fan for cooling the condenser, a temperature detector disposed in proximity to the semiconductor element, and a controller for controlling the refrigerant pump and the fan. The controller controls the number of revolutions of the refrigerant pump and that of the fan depending on a value measured by the temperature detector.

6 Claims, 2 Drawing Sheets

SEMICONDUCTOR COOLING DEVICE

BACKGROUND OF THE INVENTION

1. Field of the Invention

The present invention relates generally to a cooling device for cooling a semiconductor element which generates a substantial quantity of heat and, in particular but not exclusively, to a compact, easy-to-handle and efficient cooling device for cooling such a semiconductor element by utilization of a change in phase between a liquid phase and a vapor phase of a refrigerant.

2. Description of the Related Art

Japanese Laid-Open Patent Publication No. 2000-208683 discloses a natural circulation type cooling device for cooling a heating element by utilization of a change in phase between a liquid phase and a vapor phase of a refrigerant, as shown in FIG. 1. The cooling device shown therein is provided with a refrigerant tank 20 for storing a liquid refrigerant, a radiator 22 for radiating heat from a vapor refrigerant, and a fan (not shown) for cooling the radiator 22.

Because this cooling device is not provided with an inverter-controlled refrigerant pump, it controls the required cooling power merely by changing the number of revolutions of the fan depending on the amount of heat generated by the semiconductor element.

Furthermore, Japanese Laid-Open Patent Publication No. 2000-208683 lacks any disclosure of an avoidance system in an abnormal situation.

SUMMARY OF THE INVENTION

The present invention has been developed to overcome the above-described disadvantages.

It is accordingly an objective of the present invention to provide a highly reliable semiconductor cooling device that is low in noise level and can conduct an appropriate control by changing the amount of circulation of refrigerant depending on the amount of heat generated by a semiconductor element.

In accomplishing the above and other objectives, the semiconductor cooling device according to the present invention includes a cold plate for cooling a semiconductor element, a condenser, and an inverter-controlled refrigerant pump, all of which are fluid connected in series with each other to define a refrigerating cycle. The semiconductor cooling device also includes a fan for cooling the condenser, a temperature detector disposed in proximity to the semiconductor element, and a controller for controlling the refrigerant pump and the fan. The controller controls the number of revolutions of the refrigerant pump and that of the fan depending on a value measured by the temperature detector. The temperature detector may be accommodated in the semiconductor element.

When the amount of heat emitted from the semiconductor element is less than a predetermined level, the controller reduces the number of revolutions of the fan before that of the refrigerant pump.

When the value measured by the temperature detector increases more than a predetermined value within a predetermined period of time, the controller maximizes the number of revolutions of the fan and thereafter increases the number of revolutions of the refrigerant pump step by step while comparing the value measured by the temperature detector with a value set in the controller. Furthermore, when the number of revolutions of the refrigerant pump has reached a maximum value, if the value measured by the temperature detector does not become less than the set value, the controller outputs an alarm signal.

Alternatively, the controller watches a signal indicative of a current value of the refrigerant pump, and if such current value becomes greater than a value set in the controller, the controller outputs an alarm signal.

Again alternatively, the controller watches an operating time of the refrigerant pump, and if a total operating time of the refrigerant pump has reached a service life set in the controller, the controller outputs an alarm signal.

BRIEF DESCRIPTION OF THE DRAWINGS

The above and other objectives and features of the present invention will become more apparent from the following description of preferred embodiments thereof with reference to the accompanying drawings, throughout which like parts are designated by like reference numerals, and wherein.

DETAILED DESCRIPTION OF THE PREFERRED EMBODIMENTS

This application is based on an application No. 2003-169081 filed Jun. 13, 2003 in Japan, the content of which is herein expressly incorporated by reference in its entirety.

Figure 1:
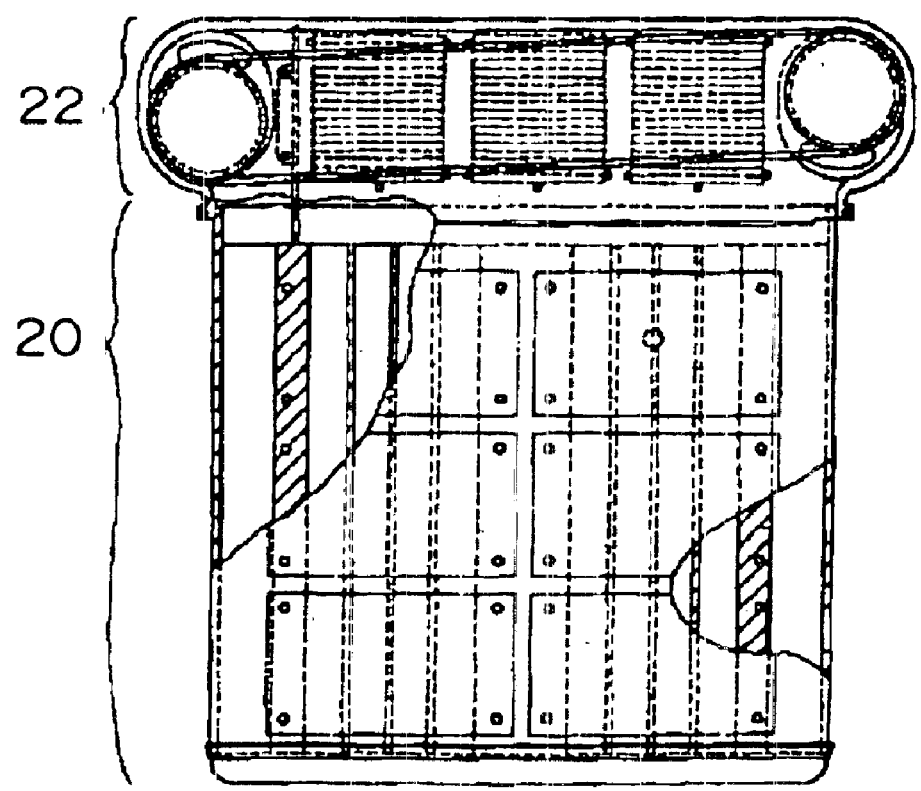
FIG. 1 depicts a front elevational view of a conventional cooling device.
Figure 2:
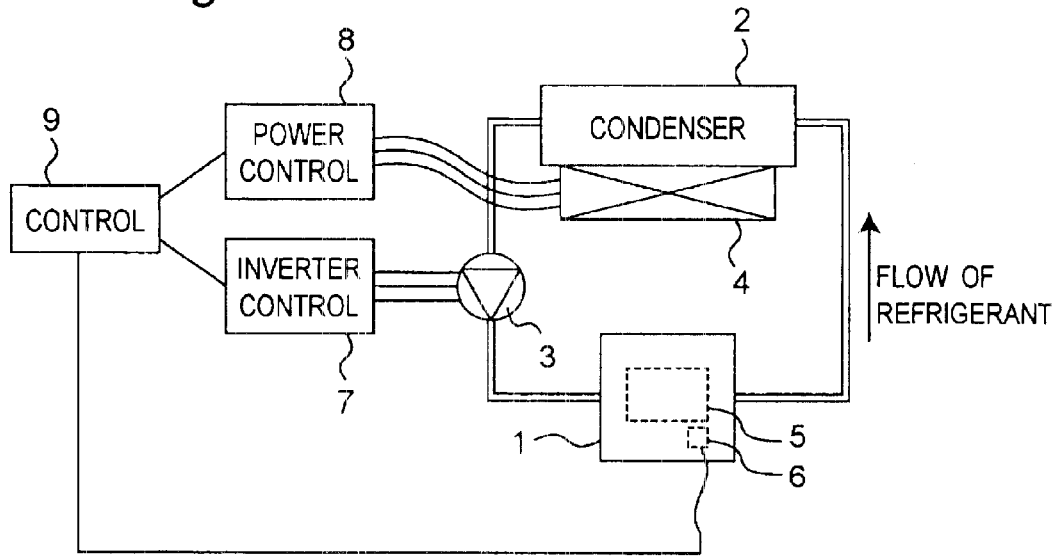
FIG. 2 depicts a refrigerating cycle of a semiconductor cooling device according to a first embodiment of the present invention.

Referring now to the drawings and in particular to FIG. 2, there is shown a refrigerating cycle of a semiconductor cooling device according to a first embodiment of the present invention. The semiconductor cooling device shown in FIG. 2 includes a cold plate 1 for cooling a highly exothermic semiconductor element 5 that tends to emit a substantial amount of heat when in operation, a condenser 2, and an inverter-controlled refrigerant pump 3, all connected in series with each other to define a refrigerating cycle. A refrigerant is filled in this refrigerating cycle. The condenser 2 is adapted to be cooled by a fan 4.

The cooling device is so designed that a liquid refrigerant emerging first from the condenser 2 is supplied towards the cold plate 1 by the refrigerant pump 3. The cold plate 1 so supplied with the refrigerant absorbs heat generated by the highly exothermic semiconductor element 5 and, in the course of absorption of the heat, a change in phase from the liquid refrigerant to a vapor refrigerant takes place within the cold plate 1. The vapor refrigerant is then supplied to the condenser 2 that is then cooled by the fan 4 so that the vapor refrigerant within the condenser 2 undergoes a phase change to a liquid refrigerant.

In this embodiment, the cold plate 1 is provided with a temperature sensor 6 mounted thereon in proximity to the semiconductor element 5, and the temperature sensor 6 is electrically connected to a controller 9. The refrigerant pump 3 is electrically connected to an inverter controller 7, while the fan 4 is electrically connected to a power controller 8. Both the inverter controller 7 and the power controller 8 are electrically connected to the controller 9.

The controller 9 appropriately controls the number of revolutions of the refrigerant pump 3 and that of the fan 4 based on a value measured by the temperature sensor 6. The controller 9 is designed so as to preferentially reduce, when the amount of heat emitted from the semiconductor element 5 is less than a predetermined level, the number of revolutions of the fan 4 before that of the refrigerant pump 3, making it possible to provide a cooling device that is low in noise level.

When the value measured by the temperature sensor 6 increases more than a predetermined value within a predetermined period of time, the controller 9 first maximizes the number of revolutions of the fan 4 and then increases the number of revolutions of the refrigerant pump 3 step by step while comparing the measured value by the temperature sensor 6 with a value set in the controller 9. When the number of revolutions of the refrigerant pump 3 has reached a maximum value, if the measured value by the temperature sensor 6 does not become less than the set value, the controller 9 outputs an alarm signal to a computer that is electrically connected to the semiconductor element 5, making it possible to enhance the reliability of the cooling device.

Although the above-described embodiment employs the temperature sensor 6, temperature measurement may be carried out by the semiconductor element 5 itself. In this case, a signal from the semiconductor element 5 is inputted into the controller 9.

Figure 3:
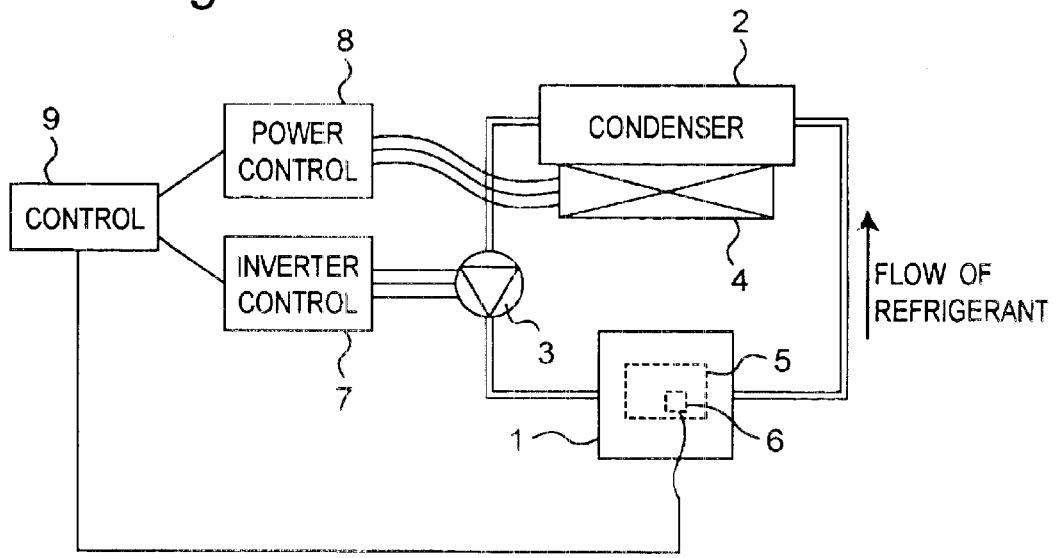
FIG. 3 depicts a refrigerating cycle of a semiconductor cooling device according to a second embodiment of the present invention.

FIG. 3 depicts a refrigerating cycle of a semiconductor cooling device according to a second embodiment of the present invention.

As shown in FIG. 3, the semiconductor element 5 is provided with a temperature detector 6 accommodated therein. A signal indicative of the current value of the refrigerant pump 3 is outputted from the inverter controller 7 to the controller 9, which in turn watches the signal and outputs, if such current value becomes greater than a value set therein, an alarm signal to a computer that is electrically connected to the semiconductor element 5. Accordingly, the refrigerant pump 3 can be replaced with a new one before its service life ends, enhancing the reliability of the cooling device.

Alternatively, the controller 9 may be designed so as to watch the operating time of the refrigerant pump 3. In this case, if the total operating time of the refrigerant pump 3 has reached a service life set in the controller 9, the controller 9 outputs an alarm signal to the computer. Accordingly, the refrigerant pump 3 can be replaced with a new one when its service life ends, enhancing the reliability of the cooling device.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A semiconductor cooling device comprising:

a cold plate for cooling a semiconductor element;

a condenser;

an inverter-controlled refrigerant pump, said cold plate, condenser and refrigerant pump being fluid connected in series with each other to define a refrigerating cycle;

a fan for cooling said condenser;

a temperature detector disposed in proximity to said semiconductor element; and a controller for controlling said refrigerant pump and said fan;

wherein said controller controls the number of revolutions of said refrigerant pump and that of said fan depending on a value measured by said temperature detector.

2. The semiconductor cooling device according to claim 1, wherein the temperature detector is accommodated in said semiconductor element.

3. The semiconductor cooling device according to claim 1, wherein when the amount of heat emitted from said semiconductor element is less than a predetermined level, said controller reduces the number of revolutions of said fan before that of said refrigerant pump.

4. The semiconductor cooling device according to claim 1, wherein when the value measured by said temperature detector increases more than a predetermined value within a predetermined period of time, said controller maximizes the number of revolutions of said fan and thereafter increases the number of revolutions of said refrigerant pump step by step while comparing the value measured by said temperature detector with a value set in said controller, and wherein when the number of revolutions of said refrigerant pump has reached a maximum value, if the value measured by said temperature detector does not become less than the set value, said controller outputs an alarm signal.

5. The semiconductor cooling device according to claim 1, wherein said controller watches a signal indicative of a current value of said refrigerant pump, and if such current value becomes greater than a value set in said controller, said controller outputs an alarm signal.

6. The semiconductor cooling device according to claim 1, wherein said controller watches an operating time of said refrigerant pump, and if a total operating time of said refrigerant pump has reached a service life set in said controller, said controller outputs an alarm signal.

* * * * *